(12) United States Patent
Wu et al.

(10) Patent No.: US 11,942,564 B2
(45) Date of Patent: Mar. 26, 2024

(54) LAMINATED PHOTOVOLTAIC DEVICE, AND PRODUCTION METHOD

(71) Applicant: LONGI GREEN ENERGY TECHNOLOGY CO., LTD., Xi'an (CN)

(72) Inventors: Zhao Wu, Xi'an (CN); Chen Xu, Xi'an (CN); Zifeng Li, Xi'an (CN)

(73) Assignee: LONGI GREEN ENERGY TECHNOLOGY CO., LTD., Xi'an (CN)

( * ) Notice: Subject to any disclaimer, the term of this patent is extended or adjusted under 35 U.S.C. 154(b) by 10 days.

(21) Appl. No.: 17/915,108

(22) PCT Filed: Nov. 3, 2020

(86) PCT No.: PCT/CN2020/126079
§ 371 (c)(1),
(2) Date: Sep. 28, 2022

(87) PCT Pub. No.: WO2021/196606
PCT Pub. Date: Oct. 7, 2021

(65) Prior Publication Data
US 2023/0155049 A1    May 18, 2023

(30) Foreign Application Priority Data

Mar. 30, 2020  (CN) .......................... 202010239146.7

(51) Int. Cl.
*H01L 31/044* (2014.01)
*H01L 31/0236* (2006.01)
(Continued)

(52) U.S. Cl.
CPC ...... *H01L 31/076* (2013.01); *H01L 31/02363* (2013.01); *H01L 31/028* (2013.01);
(Continued)

(58) Field of Classification Search
CPC .................. H01L 31/00–078; Y02E 10/50–60
(Continued)

(56) References Cited

U.S. PATENT DOCUMENTS

| | | | |
|---|---|---|---|
| 2010/0083997 | A1 | 4/2010 | Hovel |
| 2011/0162697 | A1 | 7/2011 | Sivananthan et al. |

(Continued)

FOREIGN PATENT DOCUMENTS

| | | | |
|---|---|---|---|
| CN | 101510568 | A | 8/2009 |
| CN | 102088060 | A | 6/2011 |

(Continued)

OTHER PUBLICATIONS

JP-2013183012-A English (Year: 2013).*
(Continued)

*Primary Examiner* — Bach T Dinh
(74) *Attorney, Agent, or Firm* — Bayramoglu Law Offices LLC

(57) ABSTRACT

A tandem photovoltaic device includes: a tunnel junction between an upper cell unit and a lower cell unit. The lower cell unit is a crystalline silicon cell. The tunnel junction includes: a carrier transport layer, a crystalline silicon layer, and an intermediate layer located between the carrier transport layer and the crystalline silicon layer. The carrier transport layer is a metal oxide layer. The intermediate layer includes a tunneling layer. The crystalline silicon layer has a doping concentration greater than or equal to $10^{17}$ cm$^{-3}$. The carrier transport layer is in direct contact with a shadow surface of the upper cell unit. If the crystalline silicon layer is a p-type crystalline silicon layer, a first energy level is close to a second energy level. If the crystalline silicon layer is an n-type crystalline silicon layer, a third energy level is close to a fourth energy level.

19 Claims, 2 Drawing Sheets

(51) Int. Cl.
*H01L 31/028* (2006.01)
*H01L 31/076* (2012.01)
*H01L 31/077* (2012.01)
*H01L 31/18* (2006.01)

(52) U.S. Cl.
CPC ........ *H01L 31/077* (2013.01); *H01L 31/1804* (2013.01); *H01L 31/186* (2013.01)

(58) Field of Classification Search
USPC .................................................. 136/243–265
See application file for complete search history.

(56) References Cited

U.S. PATENT DOCUMENTS

| | | | |
|---|---|---|---|
| 2016/0056323 | A1 | 2/2016 | Gaspari et al. |
| 2016/0133672 | A1 | 5/2016 | Koposov et al. |
| 2016/0163904 | A1 | 6/2016 | Mailoa et al. |
| 2016/0172522 | A1 | 6/2016 | Sameshima et al. |
| 2017/0077339 | A1 | 3/2017 | Ma et al. |
| 2019/0334048 | A1 | 10/2019 | Omelchenko et al. |

FOREIGN PATENT DOCUMENTS

| | | | |
|---|---|---|---|
| CN | 102709349 | A | 10/2012 |
| CN | 103378208 | A | 10/2013 |
| CN | 107564989 | A | 1/2018 |
| CN | 109390430 | A | 2/2019 |
| CN | 110071182 | A | 7/2019 |
| CN | 110246923 | A | 9/2019 |
| CN | 110521008 | A | 11/2019 |
| CN | 110911503 | A | 3/2020 |
| JP | 2001085718 | A | 3/2001 |
| JP | 2013183012 | A * | 9/2013 |

OTHER PUBLICATIONS

Jonathan P. Mailoa, et al., A 2-Terminal Perovskite/Silicon Multijunction Solar Cell Enabled by a Silicon Tunnel Junction, Applied Physics Letters, 2015, pp. 1-29.

Li Chun-Jing, et al., Perovskite crystalline silicon tandem solar cells, Physics, 2018, pp. 367-375, vol. 47, No. 6.

Heping Shen, et al., In situ recombination junction between p-Si and $TiO_2$ enables high-efficiency monolithic perovskite/Si tandem cells, Science Advances, 2018, pp. 1-12, 4:eaau9711.

Jianghui Zheng, et al., Large area efficient interface layer free monolithic perovskite/homo-junction-silicon tandem solar cell with over 20% efficiency, Energy & Environmental Science, 2018, 2432-2443, vol. 11.

Jinwoo Kim, et al., Characterization of p-type nitrogen-doped cuprous oxide/n-type hydrogenated microcrystalline silicon tunnel recombination junction for perovskite/crystalline silicon tandem solar cells, Japanese Journal of Applied Physics, 2018, pp. 08RB0S-1-08RB0S-4, vol. 57.

* cited by examiner

LAMINATED PHOTOVOLTAIC DEVICE, AND PRODUCTION METHOD

CROSS REFERENCE TO THE RELATED APPLICATIONS

This application is the national phase entry of International Application No. PCT/CN2020/126079, filed on Nov. 3, 2020, which is based upon and claims priority to Chinese Patent Application No. 202010239146.7, filed on Mar. 30, 2020, the entire contents of which are incorporated herein by reference.

TECHNICAL FIELD

The disclosure relates to the technical field of photovoltaics, in particular to a tandem photovoltaic device and a producing method for the same.

BACKGROUND

In tandem photovoltaic devices, sunlight can be divided into multiple bands and units of a solar cell with gradually decreasing band gaps from front to back are adopted to absorb sunlight with different energies, so as to broaden a spectral response band to sunlight and reduce energy loss. Therefore, the tandem photovoltaic devices present wide application prospect. The tandem photovoltaic devices with a crystalline silicon cell as a lower cell unit have a large space for mass production.

A tunnel junction has strong recombination ability and its thickness required to achieve high recombination rate is relatively small. Therefore, the tunnel junction is usually adopted to connect respective cell units in series in the tandem photovoltaic devices.

However, in related art, the tunnel junction of the tandem photovoltaic devices with the crystalline silicon cell as the lower cell unit is with a complicated process, serious interface recombination, large overall series resistance, and low tunneling efficiency.

SUMMARY

A tandem photovoltaic device and a producing method for the same are provided in the present disclosure, aiming at solving problems of complicated process, serious interface recombination, large overall series resistance and low tunneling efficiency in the tandem photovoltaic device.

According to a first aspect of the present disclosure, a tandem photovoltaic device is provided, including an upper cell unit and a lower cell unit, and a tunnel junction located between the upper cell unit and the lower cell unit; and the lower cell unit is a crystalline silicon cell;
the tunnel junction includes a carrier transport layer, a crystalline silicon layer and an intermediate layer located between the carrier transport layer and the crystalline silicon layer, wherein the carrier transport layer is a metal oxide layer, and the intermediate layer includes a tunneling layer;
the carrier transport layer and the crystalline silicon layer are in direct contact with the intermediate layer, respectively, and a doping concentration of the crystalline silicon layer is greater than or equal to $10^{17}$ cm$^{-3}$. The carrier transport layer is in direct contact with a shadow surface of the upper cell unit;
when the crystalline silicon layer is a p-type crystalline silicon layer, a first energy level E1 and a second energy level E2 satisfy E1−E2≤0.5 eV, wherein the first energy level E1 is an energy level at a bottom of a conduction band of a metal oxide at an interface where the metal oxide layer contacts the intermediate layer, and the second energy level E2 is an energy level at a top of a valence band of a p-type crystalline silicon at an interface where the intermediate layer contacts the p-type crystalline silicon layer; and
when the crystalline silicon layer is an n-type crystalline silicon layer, a third energy level E3 and a fourth energy level E4 satisfy −0.5 eV≤E3−E4≤0.5 eV, wherein the third energy level E3 is an energy level at a top of a valence band of the metal oxide at an interface where the metal oxide layer contacts the intermediate layer, and the fourth energy level E4 is an energy level at a bottom of a conduction hand of the n-type crystalline silicon at an interface where the intermediate layer contacts with the n-type crystalline silicon layer.

Optionally, a conductivity type of the metal oxide layer is different from that of the crystalline silicon layer.

Optionally, the metal oxide layer is made of a material selected from metal oxides with work functions greater than or equal to 3 eV, when the crystalline silicon layer is a p-type crystalline silicon layer; and
the metal oxide layer is made of a material selected from n-type metal oxides with work functions greater than or equal to 5 eV or p-type metal oxides with work functions less than or equal to 6 eV, when the crystalline silicon layer is an n-type crystalline silicon layer.

Optionally, the metal oxide layer is made of a material selected from at least one of zinc oxide, tin oxide, titanium oxide, molybdenum oxide, vanadium oxide, tungsten oxide, chromium oxide, copper oxide and hafnium oxide, when the crystalline silicon layer is a p-type crystalline silicon layer; and
the metal oxide layer is made of a material selected from at least one of nickel oxide, niobium oxide, iron oxide, cadmium oxide, iridium oxide, magnesium oxide, cesium oxide, cobalt oxide and zirconium oxide, when the crystalline silicon layer is an n-type crystalline silicon layer.

Optionally, the metal oxide layer is further doped with at least one of following elements: halogen elements, transition metal elements, alkali metal elements, rare earth elements, Group III elements, Group IV elements or Group V elements.

Optionally, the metal oxide layer is doped with at least one of following elements: strontium, chromium, iron, cobalt, nickel, copper, zinc, cerium and zirconium.

Optionally, the tunneling layer is made of a material selected from at least one of oxides of silicon, nitrides of silicon, oxynitrides of silicon, halides of silicon and metal oxides with a dielectric strength greater than 3 MV/cm.

Optionally, the intermediate layer further includes a first transition layer located between the tunneling layer and the metal oxide layer, and/or the intermediate layer further includes a second transition layer located between the tunneling layer and the crystalline silicon layer;
the first transition layer is made of a material selected from at least one product of interface reactions between the tunneling layer and the metal oxide layer; and
the second transition layer is made of a material selected from at least one product of interface reactions between the tunneling layer and the crystalline silicon layer.

Optionally, when the crystalline silicon layer is the p-type crystalline silicon layer, the energy level at the bottom of the conduction band of the metal oxide layer is the same as the first energy level E1, and the energy level at the top of the valence band of the p-type crystalline silicon layer is the same as the second energy level E2; and when the crystalline silicon layer is the n-type crystalline silicon layer, the energy level at the top of the valence band of the metal oxide layer is the same as the third energy level E3, and the energy level at the bottom of the conduction band of the n-type crystalline silicon layer is the same as the fourth energy level E4.

Optionally, in the metal oxide layer, a first surface in contact with the shadow surface of the upper cell unit has a porous morphology, an irregular morphology or a nanostructure morphology, and a second surface in contact with the intermediate layer has a flat and compact morphology.

Optionally, thicknesses of the crystalline silicon layer and the metal oxide layer are both 2 nm to 100 nm; and a thickness of the intermediate layer is 0.1 nm to 5 nm.

Optionally, a light-facing surface of the lower cell unit is provided with a light-trapping structure, and a shadow surface of the tunnel junction is adapted to a shape of the light-facing surface of the lower cell unit.

According to a second aspect of the present disclosure, there is provided a producing method for a tandem photovoltaic device, which includes following steps:

preparing a lower cell unit, wherein the lower cell unit is a crystalline silicon cell;

preparing a tunnel junction, wherein the tunnel junction includes a carrier transport layer, a crystalline silicon layer and an intermediate layer located between the carrier transport layer and the crystalline silicon layer, the carrier transport layer is a metal oxide layer. The intermediate layer includes a tunneling layer. The carrier transport layer and the crystalline silicon layer are in direct contact with the intermediate layer, respectively, and a doping concentration of the crystalline silicon layer is greater than or equal to $10^{17}$ cm$^{-3}$. The carrier transport layer is in direct contact with a shadow surface of the upper cell unit. When the crystalline silicon layer is a p-type crystalline silicon layer, a first energy level E1 and a second energy level E2 satisfy E1−E2≤0.5 eV. The first energy level E1 is an energy level at a bottom of a conduction band of a metal oxide at an interface where the metal oxide layer contacts the intermediate layer. The second energy level E2 is an energy level at a top of a valence band of a p-type crystalline silicon at an interface where the intermediate layer contacts the p-type crystalline silicon layer. When the crystalline silicon layer is an n-type crystalline silicon layer, a third energy level E3 and a fourth energy level E4 satisfy −0.5 eV≤E3−E4≤0.5 eV. The third energy level E3 is an energy level at a top of a valence band of the metal oxide at an interface where the metal oxide layer contacts the intermediate layer. The fourth energy level E4 is an energy level at a bottom of a conduction band of the n-type crystalline silicon at an interface where the intermediate layer contacts the n-type crystalline silicon layer; and preparing an upper cell unit.

Optionally, the crystalline silicon layer is prepared with one of following processes:

deposition, doping and growth; and the intermediate layer is formed;

by mutual doping of the crystalline silicon layer and the metal oxide layer, or independently; one of following processes can be adopted for the independently formed intermediate layer: deposition, wet thermal oxidation, dry thermal oxidation, plasma oxidation, and plasma enhanced or assisted oxidation; and the metal oxide layer can be prepared with one of following processes:

deposition and growth.

Optionally, the metal oxide layer is prepared by:

obtaining a film layer with a flat and compact morphology in contact with the intermediate layer by using a physical deposition method, depositing and obtaining a metal-oxide porous film precursor on a surface of the film layer with the flat and compact morphology by a chemical method, wherein the metal-oxide porous film precursor contains a pore former; and sintering the metal-oxide porous film precursor to remove the pore former, so as to obtain a surface with a porous morphology in contact with the shadow surface of the upper cell unit.

Optionally, the step of preparing the tunnel junction further includes:

performing a post-treating on the metal oxide layer, wherein the post-treating includes one of following processes: annealing, sintering, ultraviolet light treatment, light injection, electric injection, ozone oxidation and liquid phase treatment.

Optionally, the step of preparing the tunnel junction further includes:

independently forming a first transition layer between the tunneling layer and the metal oxide layer; and independently forming a second transition layer between the tunneling layer and the crystalline silicon layer.

In an embodiment of the disclosure, the lower cell unit is the crystalline silicon cell, and the tunnel junction includes the carrier transport layer, the crystalline silicon layer and the intermediate layer located between the carrier transport layer and the crystalline silicon layer. The carrier transport layer is the metal oxide layer. The intermediate layer includes a tunneling layer, and the carrier transport layer and the crystalline silicon layer are in direct contact with the intermediate layer, respectively. The carrier transport layer is directly contacted with the shadow surface of the upper cell unit, and the metal oxide layer can serve as a hole transport layer or an electron transport layer or a buffer layer of the upper cell unit, this facilitates realization of better connection performance, and additionally there is no need to separately provide the hole transport layer or the electron transport layer or the buffer layer for the upper cell unit, so that complexity of a whole structure and a number of interfaces can be reduced, the process complexity can be reduced, recombination, attenuation and the like generated when carriers cross the interfaces can be effectively reduced, and overall tunneling efficiency of a device structure can be improved. Meanwhile, the metal oxide layer and the crystalline silicon layer are quite different from each other and an abruptly doped interface structure is formed at an interface between them. The intermediate layer including the tunneling layer is added between the metal oxide layer and the crystalline silicon layer, which can further facilitate formation of the abruptly doped interface structure at the interface with barrier effect of the tunneling layer, so that the tunneling efficiency can be effectively improved, a series resistance of a tunnel junction can be reduced, and a peak tunnel current can be increased. With charge effect of oxide materials in the metal oxide layer or band pinning effect at the interface, energy level degeneracy can be realized without an extremely high doping concentration of the crystalline silicon layer, that is, the doping concentration of the crystalline silicon layer is greater than or equal to $10^{17}$ cm$^{-3}$, which reduces bulk recombination of the crystalline silicon layer and facilitates improvement of the overall tunneling efficiency of the device. With the intermediate layer including the tunneling layer inserted at the interface between the metal layer and the crystalline silicon layer, better chemical passivation can be realized. In addition, there is majority carrier accumulation on both sides of the intermediate layer including the tunneling layer in the tunnel junction, which leads to bending of an energy band, improves the tunneling efficiency, and drives away minority carriers, thus achieving good field passivation effect.

Meanwhile, when the crystalline silicon layer is the p-type crystalline silicon layer, the energy level at the bottom of the conduction band of the metal oxide at the interface where the metal oxide layer contacts the intermediate layer and the energy level at the top of the valence band of the p-type crystalline silicon at the interface where the intermediate layer contacts the p-type crystalline silicon layer satisfy the relationship described above. When the crystalline silicon layer is an n-type crystalline silicon layer, the energy level at the top of the valence band of the metal oxide at the interface where the metal oxide layer contacts the intermediate layer, and the energy level at the bottom of the conduction band of the n-type crystalline silicon at the interface where the intermediate layer contacts the n-type crystalline silicon layer satisfy the relationship described above. That is, energy levels at both sides are matched at the interface regardless of the crystalline silicon layer being the p-type crystalline silicon layer or the n-type crystalline silicon layer, so that direct tunneling can be easily realized and the tunneling efficiency can be improved.

The above description is merely a summary of the technical solutions of the present disclosure. In order to more clearly know the technological means of the present disclosure to enable the implementation according to the contents of the description, and in order to make the above and other purposes, features, and advantages of the present disclosure more apparent and understandable, the embodiments of the present disclosure are provided below.

BRIEF DESCRIPTION OF THE DRAWINGS

In order to explain embodiments of the present disclosure more clearly, the drawings required in the description of the embodiments of the present disclosure will be briefly introduced below; obviously, the drawings in the following description are only some embodiments of the present disclosure, and other drawings can be obtained according to these drawings by those of ordinary skill in the art without paying creative labor.

REFERENCE NUMBERS ARE AS FOLLOWS

1—upper cell unit, 11—perovskite coating, 12—hole transport layer, 13—ITO, 14—zinc sulfide layer, 15—copper indium gallium selenium absorption layer, 16—molybdenum selenide transport layer, 17—antireflection film, 2—lower cell unit, 21—n-type silicon wafer, 22—intrinsic amorphous silicon, 23—n-type amorphous silicon, 24—p+ layer, 25—p-type silicon wafer, 26—n+ layer, 27—PERx passivation structure, 3—tunnel junction, 4—top electrode, 5—bottom electrode, 31—metal oxide layer, 311—titanium oxide metal oxide layer, 312—aluminum-doped zinc oxide metal oxide layer, 32—crystalline silicon layer, 321—p++ layer, 33—intermediate layer, 331—SiO$_2$ tunneling layer, 332—Al$_2$O$_3$ tunneling layer.

DETAILED DESCRIPTION OF THE EMBODIMENTS

Technical schemes in the implementations of this disclosure will be described clearly and completely with reference to the drawings in the implementations of this disclosure; and it is obvious that the described implementations are part of the implementations of this disclosure, but not all of them. On a basis of the implementations in this disclosure, all other implementations obtained by the ordinary skilled in the art without any creative effort are within the protection scope of this disclosure.

Figure 1:
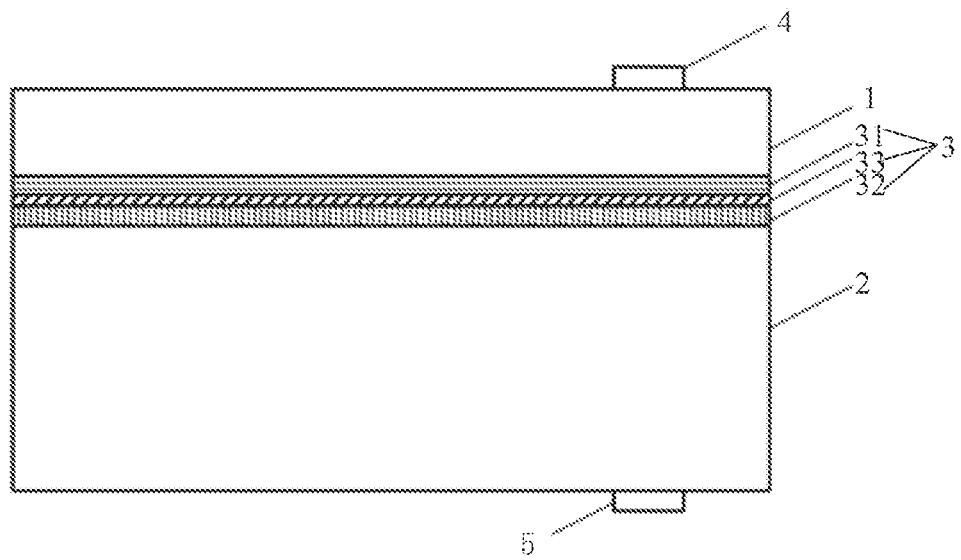
FIG. 1 shows a first tandem photovoltaic device according to an embodiment of the present disclosure.

In an embodiment of the present disclosure, reference is made to FIG. 1, which shows a first tandem photovoltaic device according to an embodiment of the present disclosure. The tandem photovoltaic device includes an upper cell unit 1 and a lower cell unit 2, and a tunnel junction 3 located between the upper cell unit 1 and the lower cell unit 2, and the tunnel junction 3 is configured for connecting the upper cell unit 1 and the lower cell unit 2 in series to form the tandem photovoltaic device. It can be understood that the upper cell unit 1 and the lower cell unit 2 have different band gaps, and a band gap of the upper cell unit 1 is larger than that of the lower cell unit 2. The lower cell unit is a crystalline silicon cell. Numbers of the tunnel junction, the upper cell unit and the lower cell unit included in the tandem photovoltaic device are not specifically limited in embodiments of the present disclosure. In FIG. 1, a top electrode is indicated by 4 and a bottom electrode is indicated by 5.

It can be understood that the tunnel junction 3 has light transmittance for transmitting remaining wave bands after absorption by the upper cell unit. A light-transmission wave bands corresponds to the light transmittance can be determined according to the remaining lights after the absorption by the upper cell unit adjacent to the tunnel junction. For example, this light-transmission wave bands corresponds to the light transmittance can be the remaining wave bands after the absorption by the upper cell unit adjacent to the tunnel junction.

Referring to FIG. 1, the tunnel junction 3 may include a carrier transport layer, a crystalline silicon layer 32, and an intermediate layer 33 located between the carrier transport layer and the crystalline silicon layer 32. The carrier transport layer is a metal oxide layer 31, which has property of carrier transmission. The intermediate layer 33 includes a tunneling layer. The carrier transport layer and the crystalline silicon layer 32 are in direct contact with the intermediate layer 33, respectively. The carrier transport layer is directly contacted with the shadow surface of the upper cell unit 1, and the metal oxide layer 31 can serve as a hole transport layer or an electron transport layer or a buffer layer of the upper cell unit 1, this facilitates realization of better connection performance, and additionally there is no need to separately provide the hole transport layer or the electron transport layer or the buffer layer for the upper cell unit 1, so that complexity of a whole structure and a number of interfaces can be reduced, process complexity can be reduced, recombination, attenuation and the like generated when carriers cross the interfaces can be effectively reduced, and overall tunneling efficiency of a device structure can be improved. Meanwhile, the metal oxide layer 31 and the crystalline silicon layer 32 are quite different from each other and an abruptly doped interface structure is formed at an interface between them. The intermediate layer 33 including the tunneling layer is added between the metal oxide layer 31 and the crystalline silicon layer 32, which can further facilitate formation of the abruptly doped interface structure at the interface with barrier effect of the tunneling layer, so that tunneling efficiency can be effectively improved, a series resistance of a tunnel junction can be reduced, and a peak tunnel current can be increased.

The crystalline silicon layer 32 is in contact with the lower cell unit 2. A doping type of the silicon layer 32 is the same as that of a light-facing surface of the lower cell unit 2. With charge effect of oxide materials in the metal oxide layer 31 or band pinning effect at the interface, energy level degeneracy can be realized without an extremely high doping concentration of the crystalline silicon layer 32, that is, the doping concentration of the crystalline silicon layer is greater than or equal to $10^{17}$ $cm^{-3}$, which reduces bulk recombination of the crystalline silicon layer 32 and facilitates improvement of the overall tunneling efficiency of the device.

With the intermediate layer 33 including the tunneling layer inserted at the interface between the metal oxide layer 31 and the crystalline silicon layer 32, better chemical passivation can be realized. A contact interface between the intermediate layer 33 including the tunneling layer and the crystalline silicon layer 32 and a contact interface between the intermediate layer 33 including the tunneling layer and the metal oxide layer 31 both have fixed charges or fixed defects, and majority carrier accumulation may occur at both sides of the intermediate layer 33 including the tunneling layer in the tunnel junction, which leads to band bending or band pinning of the crystalline silicon. With the band bending at the interface, direct tunneling can be realized after the band bending, which improves the tunneling efficiency and drives away minority carriers, thus achieving good field passivation effect.

The crystalline silicon layer 32 may be made of single crystal or polycrystalline. The crystalline silicon layer 32 may be a p-type crystalline silicon layer or an n-type crystalline silicon layer. When the crystalline silicon layer 32 is the p-type crystalline silicon layer, the first energy level E1 and the second energy level E2 satisfy E1−E2≤0.5 eV. The first energy level E1 is an energy level at a bottom of a conduction band of a metal oxide at an interface where the metal oxide layer 31 contacts the intermediate layer 33. The second energy level E2 is an energy level at a top of a valence band of a p-type crystalline silicon at an interface where the intermediate layer 33 contacts the p-type crystalline silicon layer. E1−E2 may be a positive number not greater than 0.5 eV, or zero, or a negative number. Specifically, the first energy level E1 and the second energy level E2 can be as close or flush as possible. With the first energy level E1 and the second energy level E2 being closer to each other, matching of energy levels at both sides can be realized at the interface, so that direct tunneling can be easily realized, and the tunneling efficiency can be improved.

It should be noted that energy levels at the bottom of the conduction band of the metal oxide at various positions in the metal oxide layer 31 may be the same or different. Similarly, energy levels at the top of the valence band of the p-type crystalline silicon at various positions in the p-type crystalline silicon layer may be the same or different. However, it is necessary to ensure that the first energy level E1 and the second energy level E2 meet conditions described above.

When the crystalline silicon layer 32 is an n-type crystalline silicon layer, the third energy level E3 is close to the fourth energy level E4. The third energy level E3 is an energy level at a top of a valence band of the metal oxide at an interface where the carrier transport layer contacts the intermediate layer 33. The fourth energy level E4 is an energy level at a bottom of a conduction band of the n-type crystalline silicon at an interface where the intermediate layer 33 contacts the n-type crystalline silicon layer. Specifically, the third energy level E3 and the fourth energy level E4 can be as close or flush as possible. Optionally, an absolute value of difference between the third energy level and the fourth energy level is not more than 0.5 eV. Specifically, a value obtained by the third energy level E3 subtracting the fourth energy level E4 is not more than 0.5 eV, or a value obtained by the fourth energy level E4 subtracting the third energy level E3 is not more than 0.5 eV. With the third energy level E3 and the fourth energy level E4 being closer to each other, matching of energy levels at both sides can be realized at the interface, so that direct tunneling can be easily realized, and the tunneling efficiency can be improved.

It should be noted that the energy levels at the top of the valence band of the metal oxide at various positions in the metal oxide layer 31 may be the same or different. Similarly, energy levels at the bottom of the conduction band of the n-type crystalline silicon at various positions in the n-type crystalline silicon layer may be the same or different. However, it needs to be ensured that the third energy level E3 is close to the fourth energy level E4.

When the crystalline silicon layer 32 is the p-type crystalline silicon layer, the first energy level is close to the second energy level. When the crystalline silicon layer 32 is the n-type crystalline silicon layer, the third energy level is close to the fourth energy level. Further, matching of energy levels at both sides can be realized at the interface, so that direct tunneling can be easily realized, and the tunneling efficiency can be improved.

Optionally, when the crystalline silicon layer 32 is a p-type crystalline silicon layer, the energy level at the bottom of the conduction band of the metal oxide layer 31 is the same as the first energy level E1, and the energy level at the top of the valence band of the p-type crystalline silicon layer is the same as the second energy level E2. That is, when the crystalline silicon layer 32 is the p-type crystalline silicon layer, the energy levels at the bottom of the conduction band of the metal oxide at various positions in the metal oxide layer 31 are equal, and the energy levels at the top of the valence band of the p-type crystalline silicon at various position in the p-type crystalline silicon layer are equal, so that it can be ensured sufficiently that the first energy level E1 is close to the second energy level E2.

Optionally, the energy level at the top of the valence band of the metal oxide layer is the same as the third energy level E3; and the energy level at the bottom of the conduction band of the n-type crystalline silicon layer is the same as the fourth energy level E4, when the crystalline silicon layer 32 is the n-type crystalline silicon layer. That is, when the crystalline silicon layer 32 is the n-type crystalline silicon layer, the energy levels at the top of the valence band of the metal oxide at various positions in the metal oxide layer 31 are equal, and the energy levels at the bottom of the conduction band of the n-type crystalline silicon at various position in the n-type crystalline silicon layer are equal, so that it can be ensured sufficiently that the third energy level E3 is close to the fourth energy level E4.

Optionally, the tunneling layer is made of a material selected from at least one of oxides of silicon, nitrides of silicon, oxynitrides of silicon, halides of silicon and metal oxides with a dielectric strength greater than 3 MV/cm, with a diversified material selection of the tunneling layer, and good passivation and tunneling effect. For example, the tunneling layer can be made of silicon oxide, aluminum oxide, or silicon fluoride.

Optionally, in addition to the tunneling layer described above, the intermediate layer 33 further includes a first transition layer between the tunneling layer and the metal oxide layer 31, and/or the intermediate layer further includes a second transition layer between the tunneling layer and the crystalline silicon layer 32. The first transition layer is made of a material selected from at least one product of interface reactions (which are not limited to mutual doping or ion migration) between the tunneling layer and the metal oxide layer 31. The second transition layer is made of a material selected from at least one product of interface reactions (which are not limited to mutual doping or ion migration) between the tunneling layer and the crystalline silicon layer 32. The first transition layer and the second transition layer both can function in good chemical passivation of surfaces.

The first transition layer may be formed by interface reactions (which are not limited to mutual doping or ion migration) between the tunneling layer and the metal oxide layer 31, or formed independently. The second transition layer can be formed by the interface reactions (which are not limited to mutual doping or ion migration) between the tunneling layer and the crystalline silicon layer 32, or formed independently.

Optionally, a thickness of the intermediate layer is 0.1 nm to 5 nm. Further, the thickness of the intermediate layer may be 0.5 nm to 1 nm. A thickness of the tunnel junction thus formed is small, which facilitates reducing of a tunneling distance and improves the tunneling efficiency. Meanwhile, with a small thickness of the tunnel junction, more optical shielding may not be caused to the lower cell unit.

Optionally, the conductive type of the metal oxide layer 31 is different from that of the crystalline silicon layer 32, and thus the metal oxide layer 31 and the crystalline silicon layer 32 are not only made of different materials but also with different conductive types, which is more conducive to formation of an abruptly doped interface structure at the interface with the barrier effect of the intermediate layer including the tunneling layer, so that the tunneling efficiency can be effectively improved, the series resistance of the tunnel junction can be reduced, and the peak tunnel current can be increased.

Optionally, the metal oxide layer 31 is made of a material selected from metal oxides with work functions greater than or equal to 3 eV, when the crystalline silicon layer 32 is a p-type crystalline silicon layer. The metal oxide layer 31 is made of a material selected from n-type metal oxides with work functions not less than 5 eV or p-type metal oxides with work functions not more than 6 eV when the crystalline silicon layer 32 is an n-type crystalline silicon layer. Energy level matching between the crystalline silicon layer 32 and the metal oxide layer 31 can be better realized, so that direct tunneling can be easily realized, and the tunneling efficiency can be improved.

Optionally, the metal oxide layer 31 can be further made of a material selected from at least one of zinc oxide, tin oxide, titanium oxide, molybdenum oxide, vanadium oxide, tungsten oxide, chromium oxide, copper oxide and hafnium oxide, when the crystalline silicon layer 32 is the p-type crystalline silicon layer. A work function of the metal oxide layer 31 of above materials is usually greater than or equal to 3 eV, so that better energy level matching with the p-type crystalline silicon layer can be realized, direct tunneling can be achieved more easily, and the tunneling efficiency can be further improved.

Optionally, the metal oxide layer can be further made of a material selected from at least one of nickel oxide, niobium oxide, iron oxide, cadmium oxide, iridium oxide, magnesium oxide, cesium oxide, cobalt oxide and zirconium oxide, when the crystalline silicon layer 32 is an n-type crystalline silicon layer. With above materials, better energy level matching with the n-type crystalline silicon layer can be realized, direct tunneling can be achieved more easily, and the tunneling efficiency can be further improved.

Optionally, on a basis of above material selection for the metal oxide layer 31, the metal oxide layer 31 can further doped with at least one of following elements: halogen elements, transition metal elements, alkali metal elements, rare earth elements, Group III elements, Group IV elements or Group V elements. By adding above elements into the metal oxide layer 31, an overall work function of the metal oxide layer 31 can be flexibly adjusted to achieve better energy level matching.

For example, when the crystalline silicon layer 32 is the p-type crystalline silicon layer, if the metal oxide layer 31 is made of titanium oxide, the titanium oxide can be doped or co-doped, such as $SrTiO_3$. For example, when the crystalline silicon layer 32 is the p-type crystalline silicon layer, if the metal oxide layer 31 is made of zinc oxide, the zinc oxide is doped or co-doped to obtain aluminum-doped zinc oxide and indium-gallium-doped zinc oxide. For example, when the crystalline silicon layer 32 is the p-type crystalline silicon layer, if the metal oxide layer 31 is made of tin oxide, the tin oxide is doped or co-doped to obtain indium-doped tin oxide, fluorine-doped tin oxide or the like. The above doping facilitates improving of the overall work function of the metal oxide layer 31, and then better energy level matching with the p-type crystalline silicon layer can be achieved to improve the tunneling efficiency.

For example, when the crystalline silicon layer 32 is the n-type crystalline silicon layer, the metal oxide layer 31 can be doped or co-doped, to obtain that such as $CuNb_3O_8$, $Ce_{0.8}Gd_{0.2}O_2$, $ZnIr_2O_4$, $Ca_3Co_4O_9$, etc., which facilitates reducing of the overall work function of the metal oxide layer 31, and then better energy level matching with the n-type crystalline silicon layer can be achieved to improve the tunneling efficiency.

Optionally, on a basis of above material selection for the metal oxide layer 31, the metal oxide layer 31 can further doped with at least one of following elements: strontium (Sr), chromium (Cr), iron (Fe), cobalt (Co), nickel (Ni), copper (Cu), zinc (Zn), cerium (Ce), zirconium (Zr), and the like. With above elements, the overall work function of the metal oxide layer 31 can be can further flexibly adjusted and improved to achieve better energy level matching.

Optionally, in the metal oxide layer 31, a first surface in contact with a shadow surface of the upper cell unit 1 can be with various morphologies such as a porous morphology, an irregular morphology or a nanostructure morphology, and a second surface in contact with the intermediate layer 33 has a flat and compact morphology. The first surface is a light-facing surface of the metal oxide layer 31, and the second surface is a shadow surface of the metal oxide layer 31. The shadow surface of the upper cell unit 1 can be embedded on the first surface with a porous morphology, so as to improve connection performance between the metal oxide layer 31 and the intermediate layer 33, so that the tunneling efficiency can be improved.

Optionally, thicknesses of the crystalline silicon layer 32 and the metal oxide layer 31 are both 2 nm to 100 nm. Further, the thickness of the metal oxide layer 31 may be 5 nm to 35 nm, and the thickness of the crystalline silicon layer 32 may be 5 nm to 10 nm. A thickness of the tunnel junction thus formed is small, which facilitates reducing of a tunneling distance and improves the tunneling efficiency. Meanwhile, with a small thickness of the tunnel junction, more optical shielding may not be caused to the lower cell unit.

Optionally, a light-trapping structure is provided on a light-facing surface of the lower cell unit, and the light-facing surface of the lower cell unit is a surface where the lower cell unit contacts the crystalline silicon layer. The shadow surface of the tunnel junction is adapted to a shape of the light-facing surface of the lower cell unit. The shadow surface of the tunnel junction is a surface in contact with the light-facing surface of the lower cell unit. The light-trapping structure can be an optical nanostructure, a textured structure, etc. The optical nanostructure is a regular light-trapping nanostructure. The textured structure is a pyramid structure, an inverted pyramid structure, or the like. The light-trapping structure is arranged on the light-facing surface of the lower cell unit, and the shadow surface of the tunnel junction is matched with the light-facing surface of the lower cell unit in shape, so that the light-trapping structure is also arranged on the shadow surface of the tunnel junction to increase an optical path. Meanwhile, a structure and material of the tunnel junction are conducive to obtaining the tunnel junction with a uniform thickness and function on the light-trapping structure of the light-facing surface of the lower cell unit.

Figure 2:
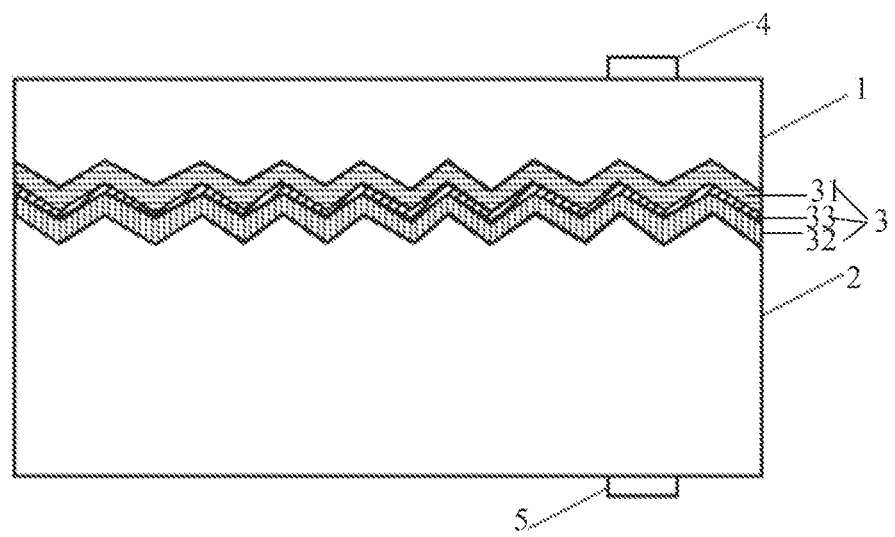
FIG. 2 shows a second tandem photovoltaic device according to an embodiment of the present disclosure.

For example, reference is made to FIG. 2, which shows a second tandem photovoltaic device according to an embodiment of the present disclosure. In this tandem photovoltaic device, the light-facing surface of the lower cell unit 2 is provided with a light-trapping structure, and the shadow surface of the tunnel junction 3 is provided with a light-trapping structure which is adapted to a shape of the light-facing surface of the lower cell unit 2. The light-facing surface of the tunnel junction 3 is provided with a light-trapping structure, and the shadow surface of the upper cell unit 1 is provided with a light-trapping structure adapted to a shape of the light-facing surface of the tunnel junction 3. The light-facing surface of the upper cell unit 1 is provided with a light-trapping structure.

In an embodiment of the disclosure, the lower cell unit is the crystalline silicon cell, and a doping type of substrate silicon of the lower cell unit is not limited, and the lower cell unit may be with a front p-n junction or a back p-n junction structure, and it can be with a single-side or double-side structure, that is, the bottom electrode can serve as a whole metal back field or can be a local grid line. The light-facing surface of the lower cell unit may have a planar structure or a light-trapping structure. A top of the light-facing surface of the lower cell unit cannot be covered with insulating material or dielectric material, such as a conventional passivation layer or antireflection layer, so as to make electrical contact with the tunnel junction. However, the top of the light-facing surface of the lower cell unit may be covered with an oxide tunneling passivation layer and a polycrystalline transmission layer, such as a TOPCon (Tunnel Oxide Passivated Contact) structure. The shadow surface of the lower cell unit may directly cover an electrode. In order to improve photoelectric conversion efficiency of the lower cell unit, any structure may be designed on the shadow surface of the lower cell unit, for example, a passivation layer and an opened electrical lead-out structure (such as Passivated Emitter and Rear Contact (PERC)) can be made; or full or local heavy doping (such as PERT (Passivated Emitter and Rear Totally-Diffused) and PERL (Passivated Emitter and Rear Locally-Diffused)) may be further adopted; or an oxide tunneling passivation layer and a polycrystalline transport layer structure (such as TOPCon) may be adopted.

In the embodiments of the present disclosure, the upper cell unit is not specifically limited. For example, a band gap of the upper cell unit may be 1.5 eV to 2.3 eV. For example, the band gap of the upper cell unit may be 1.7 eV to 1.8 eV. For example, the upper cell unit may be a perovskite thin film solar cell, an organic thin film solar cell, a quantum dot thin film solar cell, an amorphous silicon thin film solar cell, an amorphous silicon carbide thin film solar cell, a copper indium gallium selenium thin film solar cell, a cadmium telluride thin film solar cell, a gallium arsenide thin film solar cell, or the like. The upper cell unit may contain one or more buffer layers or matching layers needed to contact with the tunnel junction so as to further reduce resistance or recombination between the tunnel junction and the upper cell unit. The buffer layer or matching layer has functions of energy band buffering, energy band matching, lattice matching and contact resistance reduction, so as to further reduce the overall series resistance of the device.

A producing method of a tandem photovoltaic device is further provided in an embodiment of the disclosure. The method comprises following steps S1 to S3.

In step S1, a lower cell unit is prepared. The lower cell unit is a crystalline silicon cell.

In step S2, a tunnel junction is prepared. The tunnel junction includes a carrier transport layer, a crystalline silicon layer and an intermediate layer located between the carrier transport layer and the crystalline silicon layer. The carrier transport layer is a metal oxide layer. The intermediate layer includes a tunneling layer. The carrier transport layer and the crystalline silicon layer are in direct contact with the intermediate layer, respectively, and a doping concentration of the crystalline silicon layer is greater than or equal to $10^{17}$ cm$^{-3}$. The carrier transport layer is in direct contact with a shadow surface of the upper cell unit. When the crystalline silicon layer is a p-type crystalline silicon layer, a first energy level E1 and a second energy level E2 satisfy E1−E2≤0.5 eV. The first energy level E1 is an energy level at a bottom of a conduction band of a metal oxide at an interface where the metal oxide layer contacts the intermediate layer. The second energy level E2 is an energy level at a top of a valence band of a p-type crystalline silicon at an interface where the intermediate layer contacts the p-type crystalline silicon layer. When the crystalline silicon layer is an n-type crystalline silicon layer, a third energy level E3 and a fourth energy level E4 satisfy −0.5 eV≤E3−E4≤0.5 eV. The third energy level E3 is an energy level at a top of a valence band of the metal oxide at an interface where the metal oxide layer contacts the intermediate layer. The fourth energy level E4 is an energy level of a conduction hand at a bottom of the n-type crystalline silicon at an interface where the intermediate layer contacts the n-type crystalline silicon layer.

In step S3, an upper cell unit is prepared.

Description of the lower cell unit, the upper cell unit and the tunnel junction in the above steps S1 to S3 can refer to description in the previous embodiment, and the same or similar beneficial effects can be achieved, which, in order to avoid repetition, will not be described repeatedly here.

In the embodiment of the present disclosure, a sequence of steps S1 to S3 is not particularly limited. For example, in a process of preparing the lower cell unit, in view of a fact that some of layers of the lower cell unit cannot bear a high temperature, the layers which cannot bear the high temperature in the lower cell unit can be prepared after the tunnel junction or other parts of the tandem photovoltaic device have been prepared.

Optionally, the crystalline silicon layer can be prepared with one of following processes: deposition, doping and growth. The deposition process can include depositing a crystalline silicon layer of amorphous or nanocrystalline silicon with a corresponding doping concentration on the light-facing surface of the lower cell unit by PVD, CVD or other methods and performing rapid or slow annealing to crystallize. The growth process can include CVD, PVD, ALD and other vapor growth methods, or MBE (Molecular beam epitaxy) and other epitaxial growth methods, in which performance of the layer can be further improved by fast or slow annealing after growth. Alternatively, further doping can be made to the light-facing surface of the lower cell unit by thermal diffusion, particle injection, laser doping or other methods.

Optionally, the intermediate layer may be formed by mutual doping of the crystalline silicon layer and the metal oxide layer, or formed independently. Specifically, the intermediate layer can be formed with a higher substrate temperature in the metal oxide deposition process or an added post-annealing process, One of the following processes can be adopted for the independently formed intermediate layer: deposition, wet thermal oxidation, dry thermal oxidation, plasma oxidation, and plasma enhanced or assisted oxidation. Specifically, PVD, CVD, ALD or other deposition processes can be adopted. Alternatively, wet thermal oxidation (such as $HNO_3$), dry thermal oxidation, $O_3$, $UV/O_3$, plasma oxidation, PECVD-assisted $N_2O$-oxidized $SiO_x$, CVD or other processes can be used. For example, when the tunneling layer of the intermediate layer is made of silicon oxide, wet thermal oxygen (such as $HNO_3$) or dry thermal oxygen (such as $O_3$ and $UV/O_3$) can be used.

Optionally, the second transition layer located between the tunneling layer and the crystalline silicon layer can be formed by interface reactions such as mutual doping or ion migration of the tunneling layer and the crystalline silicon layer, or can be formed independently. The first transition layer located between the tunneling layer and the metal oxide layer can also be formed by interface reactions such as mutual doping or ion migration between the tunneling layer and the metal oxide layer, or can be formed independently.

Optionally, the metal oxide layer can be prepared with one of following processes: deposition and growth. Specifically, the deposition process includes vacuum methods such as PVD, CVD and ALD, or chemical methods such as coating and a Czochralski method, and the growth can be vacuum growth or solution growth. It can be realized by deposition (including a post-annealing crystallization process), growth, or the like on the light-facing surface of the intermediate layer. The structure and properties of this layer can be improved by high-temperature processes such as post-annealing.

For example, a zinc oxide or tin oxide thin film can be deposited by MD, and then the film is rapidly annealed to further improve crystallinity.

Optionally, the metal oxide layer can be prepared with following steps. A film layer with a flat and compact morphology in contact with the intermediate layer is obtained using a physical deposition method. Then, a metal-oxide porous film precursor is deposited and obtained on a surface of the film layer with the flat and compact morphology by using a chemical method. The metal-oxide porous film precursor is filled with a pore former. The pore former can be organic. The metal-oxide porous film precursor is sintered to remove the pore former filled therein, so as to obtain a surface with a porous morphology in contact with the shadow surface of the upper cell unit. That is, different morphologies can be obtained by different processes. Meanwhile, crystallinity of the film with the flat and compact morphology can be improved during the sintering process.

For example, a titanium oxide film with a lower surface having a flat and compact morphology can be obtained by a physical deposition method. Then, a porous titanium oxide film precursor is deposited and obtained on the surface of the titanium oxide film with the flat and compact morphology by using a chemical deposition method. The porous titanium oxide film precursor is filled with the pore former with titanium oxide as a framework. Then, the porous titanium oxide film precursor is sintered, and the pore former is removed in the sintering process to obtain a porous surface. Meanwhile, crystallinity of the lower titanium oxide with the flat and compact morphology can be improved during the sintering process.

Optionally, a step in which the tunnel junction is prepared further includes post-treating the metal oxide layer. The post-treating includes one of following processes: annealing, sintering, ultraviolet light treatment, light injection, electric injection, ozone oxidation and liquid phase treatment. With the above post-treating, fixed charges on the surface of the metal oxide layer or the interface defects can be increased, so that the energy band at the interface is bent and direct tunneling can be realized.

Several tandem photovoltaic devices and their manufacturing processes are illustrated in the following.

Figure 3:
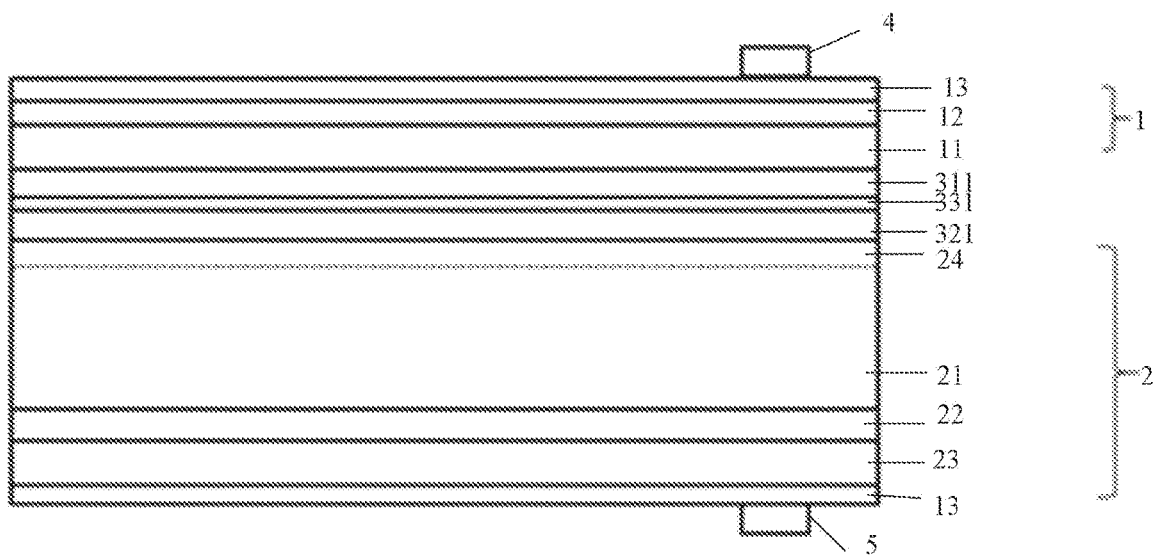
FIG. 3 shows a third tandem photovoltaic device according to an embodiment of the present disclosure.

Reference is made to FIG. 3, which shows a third tandem photovoltaic device according to an embodiment of the present disclosure. In the tandem photovoltaic device shown in FIG. 3, the lower cell unit 2 is made of an n-type silicon wafer 21, in which intrinsic amorphous silicon 22 is used for passivating and n-type amorphous silicon 23 is deposited for electronic transmission. Because the amorphous silicon has poor temperature tolerance, the amorphous silicon can be deposited after the tunnel junction or other parts of the tandem photovoltaic device have been prepared. The light-facing surface and the shadow surface of the lower cell unit 2 may have a pyramid textured structure. Perovskite with a wide band gap is adopted in the upper cell unit 1 as an absorption layer, and a band gap width of the absorption layer is 1.6 eV to 1.8 eV. The absorption layer has a morphology that conforms to the light-facing surface of the lower cell unit 2. In the tunnel junction shown in FIG. 3, the metal oxide layer 31 is made of $TiO_2$, the tunneling layer in the intermediate layer 33 is made of $SiO_2$, and the crystalline silicon layer 32 is of a p++ type.

The manufacturing process of the tandem photovoltaic device shown in FIG. 3 is as follows.

Firstly, a silicon wafer is cleaned and its upper and lower surfaces are textured. A p-type layer is made on a light-facing surface of the n-type silicon wafer 21 by diffusion or by deposition followed by crystallization to form a p-n junction, and a crystalline silicon layer is prepared on the light-facing surface of the p-type layer by thermal diffusion or by amorphous silicon deposition followed by crystallization. The crystalline silicon layer 32 is heavily p++ doped with a doping concentration of $10^{19}$ cm$^{-3}$. The p-type layer and a pH layer 321 of the crystalline silicon layer can be made by one-step diffusion or by deposition followed by crystallization, and a transition p+ layer 24 is formed between them. A thickness of the p++ layer 321 of the crystalline silicon layer is 5 nm, which is calculated from a position where the doping concentration reaches $10^{19}$ cm$^{-3}$.

A SiO$_2$ tunneling layer 331 with a thickness of 0.8 nm is fabricated on the light-facing surface of the p++ layer 321 of the crystalline silicon layer, which can be made by surface oxidation (thermal oxidation, chemical oxidation), ALD deposition or other methods to form good chemical passivation.

A titanium oxide metal oxide layer 311 with a thickness of 20 nm is fabricated on the SiO$_2$ tunneling layer 331. It can be made by sintering after chemical deposition, vacuum deposition or other methods, and can contain a double-layer titanium oxide structure (one layer of dense titanium oxide and one layer of porous titanium oxide).

High-temperature processes are allowed for the above layers, from cleaning of the silicon wafer to complete fabrication of the titanium oxide metal oxide layer 311.

Intrinsic amorphous silicon 22 and n-type amorphous silicon 23 are deposited on a shadow surface of a resulting structure to complete a bottom cell structure. A perovskite coating 11 and a hole transport layer 12 are deposited on a light-facing surface of the resulting structure to complete a top cell structure. ITO 13 is deposited on both sides of the resulting structure and electrodes are deposited to complete a whole structure.

Figure 4:
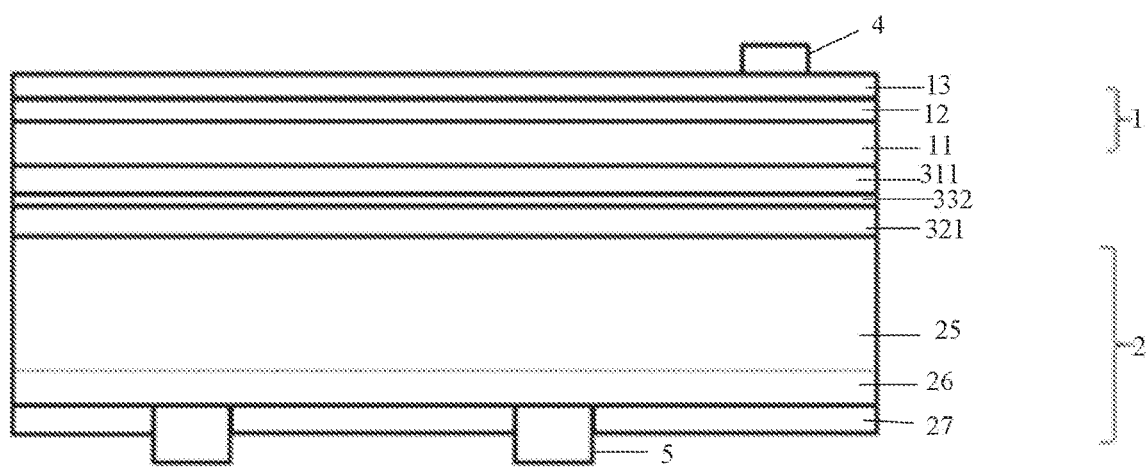
FIG. 4 shows a fourth tandem photovoltaic device according to an embodiment of the present disclosure.

Reference is made to FIG. 4, which shows a fourth tandem photovoltaic device according to an embodiment of the present disclosure. In the tandem photovoltaic device shown in FIG. 4, the lower cell unit 2 is made of a p-type silicon wafer 25, and the shadow surface is made by PERx (PERC, PERT, PERL) passivation technologies, the lower cell unit 2 is textured on both sides and can receive light on both sides. Perovskite with a wide band gap is adopted in the upper cell unit 1 as an absorption layer, and a band gap width of the absorption layer is 1.6 to 1.8 eV. The absorption layer has a morphology that conforms to the light-facing surface of the lower cell unit 2. In the tunnel junction shown in FIG. 4, the metal oxide layer is made of TiO$_2$, the tunneling layer in the intermediate layer is made of Al$_2$O$_3$, and the crystalline silicon layer is of a p++ type.

The manufacturing process of the tandem photovoltaic device shown in FIG. 4 is as follows.

Firstly, a silicon wafer is cleaned and its upper and lower surfaces are textured. A n-type layer is made on a shadow surface of the p-type silicon wafer 25 by diffusion to form a p-n junction, and a crystalline silicon layer is made on the light-facing surface of the p-type silicon wafer 25 by diffusion or by deposition followed by crystallization. The crystalline silicon layer 32 is heavily p++ doped with a doping concentration of $10^{19}$ cm$^{-3}$. A transition p+ layer 24 is formed between the p-type layer and the p++ layer 321 of the crystalline silicon layer. A thickness of the p++ layer 321 of the crystalline silicon layer is 5 nm, which is calculated from a position where the doping concentration reaches $10^{19}$ cm$^{-3}$.

An Al$_2$O$_3$ tunneling layer with a thickness of 0.8 nm is fabricated on the light-facing surface of the p++ layer 321 of the crystalline silicon layer, which can be made by surface oxidation (thermal oxidation, chemical oxidation, ALD deposition or other methods to form good chemical passivation.

A titanium oxide metal oxide layer 311 with a thickness of 20 nm is fabricated on the Al$_2$O$_3$ tunneling layer 332. It can be made by sintering after chemical deposition, vacuum deposition or other methods, and can contain a double-layer titanium oxide structure (one layer of dense titanium oxide and one layer of porous titanium oxide). After deposition, post-treatment, rapid annealing at 450° C. is adopted to improve a morphology of titanium oxide, and charges can be injected into titanium oxide in this process at the same time.

A perovskite coating 11 and a hole transport layer 12 are deposited on a light-facing surface of the resulting structure to complete a top cell structure. A passivation layer is deposited on a shadow surface of the resulting structure and a PERC passivation structure is formed. ITO 13 is deposited on both sides of the resulting structure and electrodes are deposited or printed to complete a whole structure.

Figure 5:
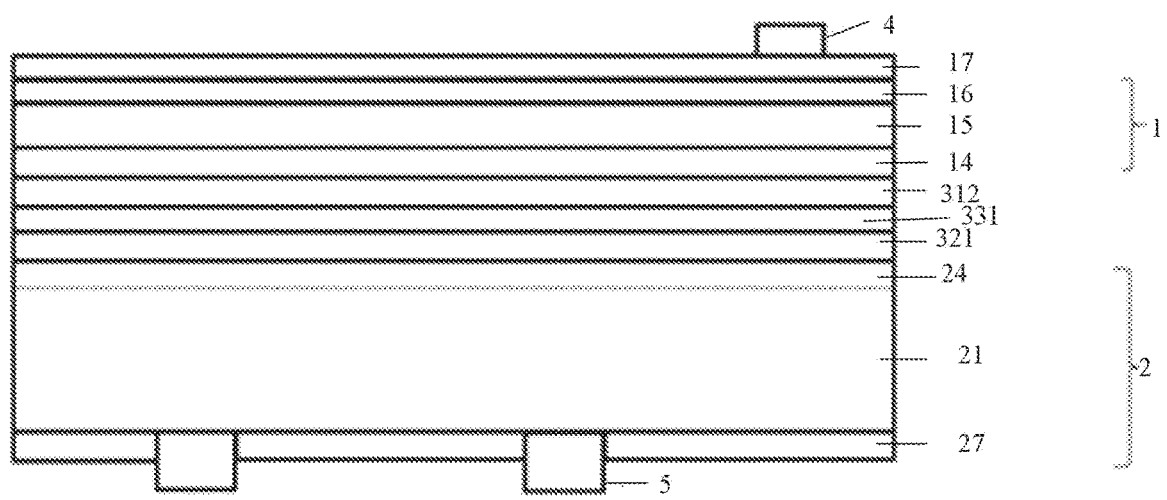
FIG. 5 shows a fifth tandem photovoltaic device according to an embodiment of the present disclosure.

Reference is made to FIG. 5, which shows a fifth tandem photovoltaic device according to an embodiment of the present disclosure. In the tandem photovoltaic device shown in FIG. 5, the lower cell unit 2 is made of a n-type silicon wafer 21, and the shadow surface is made by PERx (PERC, PERT, PERL) passivation technologies, the lower cell unit 2 is textured on both sides and can receive light on both sides. Copper indium gallium selenium with a wide band gap is adopted in the upper cell unit 1 as an absorption layer, and a band gap width of the absorption layer is 1.6 to 1.8 eV. The absorption layer has a morphology that conforms to the light-facing surface of the lower cell unit 2. In the tunnel junction shown in FIG. 5, the metal oxide layer is made of aluminum-doped zinc oxide, the tunneling layer in the intermediate layer is made of SiO$_2$, and the crystalline silicon layer is of a p++ type.

The manufacturing process of the tandem photovoltaic device shown in FIG. 5 is as follows.

Firstly, a silicon wafer is cleaned and its upper and lower surfaces are textured. A p-type layer is made on a light-facing surface of the n-type silicon wafer 21 by diffusion or by deposition followed by crystallization to form a p-n junction, and a crystalline silicon layer is made of amorphous silicon on the light-facing surface of the p-type layer by diffusion or by deposition followed by crystallization. The crystalline silicon layer 32 is heavily p++ doped with a doping concentration of $10^{20}$ cm$^{-3}$. A transition p+ layer 24 is formed between the p-type layer and the p++ layer 321 of the crystalline silicon layer. A thickness of the p++ layer 321 of the crystalline silicon layer is 8 nm, which is calculated from a position where the doping concentration reaches $10^{20}$ cm$^{-3}$.

A SiO$_2$ tunneling layer 331 with a thickness of 0.8 nm is fabricated on the light-facing surface of the p++ layer 321 of the crystalline silicon layer, which can be made by surface oxidation (thermal oxidation, chemical oxidation), ALD deposition or other methods to form good chemical passivation.

An aluminum-doped zinc oxide metal oxide layer 312 with a thickness of 30 nm is deposited on the SiO$_2$ tunneling layer 331. It can be made by PVD or CVD, with a substrate temperature of 150 to 300° C. With a process of depositing this layer, a silicon oxide layer of about 0.6 nm can be formed between them.

A zinc sulfide layer 14 is deposited on a light-facing surface of the aluminum-doped zinc oxide layer 312, using PVD or CVD or chemical methods. A copper indium gallium selenide absorption layer 15 and a molybdenum selenide transport layer 16 are deposited on a light-facing surface of the resulting structure. A passivation layer is deposited on a shadow surface of the resulting structure and a PERC passivation structure is formed. An antireflection film 17 is deposited on the light-facing surface of the resulting structure. Electrodes are deposited or printed on both sides of the resulting structure to complete a whole structure.

In the embodiments of the present disclosure, respective steps of the method can refer to relevant records in the previous embodiment, and the same or similar beneficial effects can be achieved, which, in order to avoid repetition, will not be described repeatedly here.

It should be noted that, for sake of simple description, the method embodiments are all expressed as combination of a series of action, but it should be known by those skilled in the art should that the embodiments of the present disclosure are not limited by a sequence of the described actions, because some of the steps can be performed in other sequences or simultaneously according to the embodiments of the present disclosure. Secondly, it also should be known by those skilled in the art that the embodiments described in the specification are all preferred embodiments, and the actions involved are not necessarily necessary for the embodiments of the present disclosure.

In the embodiment of the disclosure, the tandem photovoltaic device and the producing method for the same, respective devices and the like can be referred to each other.

The embodiments of the present disclosure have been described with reference to the drawings, but the present disclosure is not limited to the specific embodiments described above, which are merely illustrative rather than restrictive. Many forms can be made by those skilled in the art without departing from spirit of the present disclosure and the scope of the claims upon inspiration of the present disclosure, all of which are within the scope of the present disclosure.

What is claimed is:

1. A tandem photovoltaic device, comprising an upper cell unit, a lower cell unit and a tunnel junction located between the upper cell unit and the lower cell unit, wherein the lower cell unit is a crystalline silicon cell;
    the tunnel junction comprises a carrier transport layer, a crystalline silicon layer and an intermediate layer located between the carrier transport layer and the crystalline silicon layer, wherein the carrier transport layer is a metal oxide layer, and the intermediate layer comprises a tunneling layer;
    the carrier transport layer and the crystalline silicon layer are in direct contact with the intermediate layer, respectively, and a doping concentration of the crystalline silicon layer is greater than or equal to $10^{17}$ cm$^{-3}$;
    the carrier transport layer is in direct contact with a shadow surface of the upper cell unit;
    when the crystalline silicon layer is a p-type crystalline silicon layer, a first energy level E1 and a second energy level E2 satisfy E1−E2≤0.5 eV, wherein the first energy level E1 is an energy level at a bottom of a conduction band of a metal oxide at an interface where the metal oxide layer contacts the intermediate layer, and the second energy level E2 is an energy level at a top of a valence band of a p-type crystalline silicon at an interface where the intermediate layer contacts the p-type crystalline silicon layer; and
    when the crystalline silicon layer is an n-type crystalline silicon layer, a third energy level E3 and a fourth energy level E4 satisfy −0.5 eV≤E3−E4≤0.5 eV, wherein the third energy level E3 is an energy level at a top of a valence band of the metal oxide at the interface where the metal oxide layer contacts the intermediate layer, and the fourth energy level E4 is an energy level at a bottom of a conduction band of an n-type crystalline silicon at an interface where the intermediate layer contacts the n-type crystalline silicon layer.

2. The tandem photovoltaic device according to claim 1, wherein a conductivity type of the metal oxide layer is different from a conductivity type of the crystalline silicon layer.

3. The tandem photovoltaic device according to claim 1, wherein
    the metal oxide layer is made of a material selected from metal oxides with work functions greater than or equal to 3 eV, when the crystalline silicon layer is the p-type crystalline silicon layer; and
    the metal oxide layer is made of a material selected from n-type metal oxides with work functions greater than or equal to 5 eV or p-type metal oxides with work functions less than or equal to 6 eV, when the crystalline silicon layer is the n-type crystalline silicon layer.

4. The tandem photovoltaic device according to claim 1, wherein
    the metal oxide layer is made of a material selected from at least one of zinc oxide, tin oxide, titanium oxide, molybdenum oxide, vanadium oxide, tungsten oxide, chromium oxide, copper oxide and hafnium oxide, when the crystalline silicon layer is the p-type crystalline silicon layer; and
    the metal oxide layer is made of a material selected from at least one of nickel oxide, niobium oxide, iron oxide, cadmium oxide, iridium oxide, magnesium oxide, cesium oxide, cobalt oxide and zirconium oxide, when the crystalline silicon layer is the n-type crystalline silicon layer.

5. The tandem photovoltaic device according to claim 3, wherein the metal oxide layer is further doped with at least one of following elements: halogen elements, transition metal elements, alkali metal elements, rare earth elements, Group III elements, Group IV elements or Group V elements.

6. The tandem photovoltaic device according to claim 5, wherein the metal oxide layer is doped with at least one of following elements: strontium, chromium, iron, cobalt, nickel, copper, zinc, cerium and zirconium.

7. The tandem photovoltaic device according to claim 1, wherein the tunneling layer is made of a material selected from at least one of oxides of silicon, nitrides of silicon, oxynitrides of silicon, halides of silicon and metal oxides with a dielectric strength greater than 3 MV/cm.

8. The tandem photovoltaic device according to claim 1, wherein the intermediate layer further comprises a first transition layer located between the tunneling layer and the metal oxide layer, and/or the intermediate layer further comprises a second transition layer located between the tunneling layer and the crystalline silicon layer;
    the first transition layer is made of a material selected from at least one product of interface reactions between the tunneling layer and the metal oxide layer; and
    the second transition layer is made of a material selected from at least one product of interface reactions between the tunneling layer and the crystalline silicon layer.

9. The tandem photovoltaic device according to claim 1, wherein
    when the crystalline silicon layer is the p-type crystalline silicon layer, the energy level at the bottom of the conduction band of the metal oxide layer is same as the first energy level and the energy level at the top of the valence band of the p-type crystalline silicon layer is same as the second energy level E2; and when the crystalline silicon layer is the n-type crystalline silicon layer, the energy level at the top of the valence band of the metal oxide layer is same as the third energy level E3, and the energy level at the bottom of the conduction band of the n-type crystalline silicon layer is same as the fourth energy level E4.

10. The tandem photovoltaic device according to claim 1, wherein in the metal oxide layer, a first surface in contact with the shadow surface of the upper cell unit has a porous morphology, an irregular morphology or a nanostructure morphology, and a second surface in contact with the intermediate layer has a flat and compact morphology.

11. The tandem photovoltaic device according to claim 1, wherein a thickness of the crystalline silicon layer and a thickness of the metal oxide layer are both 2 nm to 100 nm; and
a thickness of the intermediate layer is 0.1 nm to 5 nm.

12. The tandem photovoltaic device according to claim 1, wherein a light-facing surface of the lower cell unit is provided with a light-trapping structure, and a shadow surface of the tunnel junction is adapted to a shape of the light-facing surface of the lower cell unit.

13. A producing method for a tandem photovoltaic device, comprising:
preparing a lower cell unit, wherein the lower cell unit is a crystalline silicon cell;
preparing a tunnel junction, wherein the tunnel junction comprises a carrier transport layer, a crystalline silicon layer and an intermediate layer located between the carrier transport layer and the crystalline silicon layer, the carrier transport layer is a metal oxide layer, the intermediate layer comprises a tunneling layer; the carrier transport layer and the crystalline silicon layer are in direct contact with the intermediate layer, respectively, and a doping concentration of the crystalline silicon layer is greater than or equal to $10^{17}$ cm$^{-3}$; the carrier transport layer is in direct contact with a shadow surface of the upper cell unit; when the crystalline silicon layer is a p-type crystalline silicon layer, a first energy level E1 and a second energy level E2 satisfy E1−E2≤0.5 eV, wherein the first energy level E1 is an energy level at a bottom of a conduction band of a metal oxide at an interface where the metal oxide layer contacts the intermediate layer, and the second energy level E2 is an energy level at a top of a valence band of a p-type crystalline silicon at an interface where the intermediate layer contacts the p-type crystalline silicon layer; and when the crystalline silicon layer is an n-type crystalline silicon layer, a third energy level E3 and a fourth energy level E4 satisfy −0.5 eV≤E3−E4≤0.5 eV, wherein the third energy level E3 is an energy level at a top of a valence band of the metal oxide at the interface where the metal oxide layer contacts the intermediate layer, and the fourth energy level E4 is an energy level at a bottom of a conduction band of an n-type crystalline silicon at an interface where the intermediate layer contacts the n-type crystalline silicon layer; and
preparing an upper cell unit.

14. The method according to claim 13, wherein the crystalline silicon layer is prepared with one of following processes: deposition, doping and growth;
the intermediate layer is formed by mutual doping of the crystalline silicon layer and the metal oxide layer, or the intermediate layer is formed independently; wherein one of following processes is adopted for independently forming the intermediate layer: deposition, wet thermal oxidation, dry thermal oxidation, plasma oxidation, and plasma enhanced or assisted oxidation; and
the metal oxide layer is prepared with one of following processes: deposition and growth.

15. The method according to claim 13, wherein the metal oxide layer is prepared by:
obtaining a film layer with a flat and compact morphology in contact with the intermediate layer by using a physical deposition method;
depositing and obtaining a metal-oxide porous film precursor on a surface of the film layer with the flat and compact morphology by a chemical method, wherein the metal-oxide porous film precursor contains a pore former; and
sintering the metal-oxide porous film precursor to remove the pore former, so as to obtain a surface with a porous morphology in contact with the shadow surface of the upper cell unit.

16. The method according to claim 13, wherein the step of preparing the tunnel junction further comprises:
performing a post-treating on the metal oxide layer, wherein the post-treating comprises one of following processes: annealing, sintering, ultraviolet light treatment, light injection, electric injection, ozone oxidation and liquid phase treatment.

17. The method according to claim 13, wherein the step of preparing the tunnel junction comprises:
independently forming a first transition layer between the tunneling layer and the metal oxide layer; and
independently forming a second transition layer between the tunneling layer and the crystalline silicon layer.

18. The tandem photovoltaic device according to claim 4, wherein the metal oxide layer is further doped with at least one of following elements: halogen elements, transition metal elements, alkali metal elements, rare earth elements, Group III elements, Group IV elements or Group V elements.

19. The method according to claim 14, wherein the metal oxide layer is prepared by:
obtaining a film layer with a flat and compact morphology in contact with the intermediate layer by using a physical deposition method;
depositing and obtaining a metal-oxide porous film precursor on a surface of the film layer with the flat and compact morphology by a chemical method, wherein the metal-oxide porous film precursor contains a pore former; and
sintering the metal-oxide porous film precursor to remove the pore former to obtain a surface with a porous morphology in contact with the shadow surface of the upper cell unit.

* * * * *